United States Patent [19]
Kilpatrick et al.

[11] Patent Number: 5,003,156
[45] Date of Patent: Mar. 26, 1991

[54] DUAL CONFIGURATION CONNECTOR PORT FOR BURN-IN SYSTEMS

[75] Inventors: Robert A. Kilpatrick, Santa Clara; Sherry M. Hefner, San Jose, both of Calif.

[73] Assignee: Time Temperature, Inc., Santa Clara, Calif.

[21] Appl. No.: 323,321

[22] Filed: Mar. 14, 1989

[51] Int. Cl.⁵ ............................................. H05B 1/00
[52] U.S. Cl. .................... 219/209; 219/385; 324/158 F
[58] Field of Search ............... 219/209, 385, 386, 392; 324/158 F

[56] References Cited

U.S. PATENT DOCUMENTS

| | | | |
|---|---|---|---|
| 3,614,540 | 10/1971 | Slusser | 219/385 |
| 4,145,620 | 3/1979 | Dice | 307/149 |
| 4,374,317 | 2/1983 | Bradshaw | 219/385 |
| 4,636,726 | 1/1987 | Santomango et al. | 324/158 F |
| 4,692,694 | 9/1987 | Yokoi et al. | 324/158 F |
| 4,695,707 | 9/1987 | Young | 219/392 |
| 4,777,434 | 10/1988 | Miller et al. | 324/158 F |

FOREIGN PATENT DOCUMENTS 2748590 10/1977 Fed. Rep. of Germany ... 324/158 F
2813906 10/1979 Fed. Rep. of Germany ... 324/158 F

OTHER PUBLICATIONS

"Advanced Computerized Burn-In System", by Jensen et al., IBM Technical Disclosure Bulletin, vol. 27, No. 5, 10/1984, pp. 2894–2895.

Primary Examiner—Geoffrey S. Evans
Attorney, Agent, or Firm—Flehr, Hohbach, Test, Albritton & Herbert

[57] ABSTRACT

Apparatus for burning-in of integrated circuitry which utilizes a dual interface port configuration between burn-in boards and exercising and measuring circuitry so that two burn-in board configurations can be simultaneously used for burning-in of integrated circuits within the same system. This can be achieved even within the same zone when the input voltage and exercising requirements are the same.

6 Claims, 4 Drawing Sheets

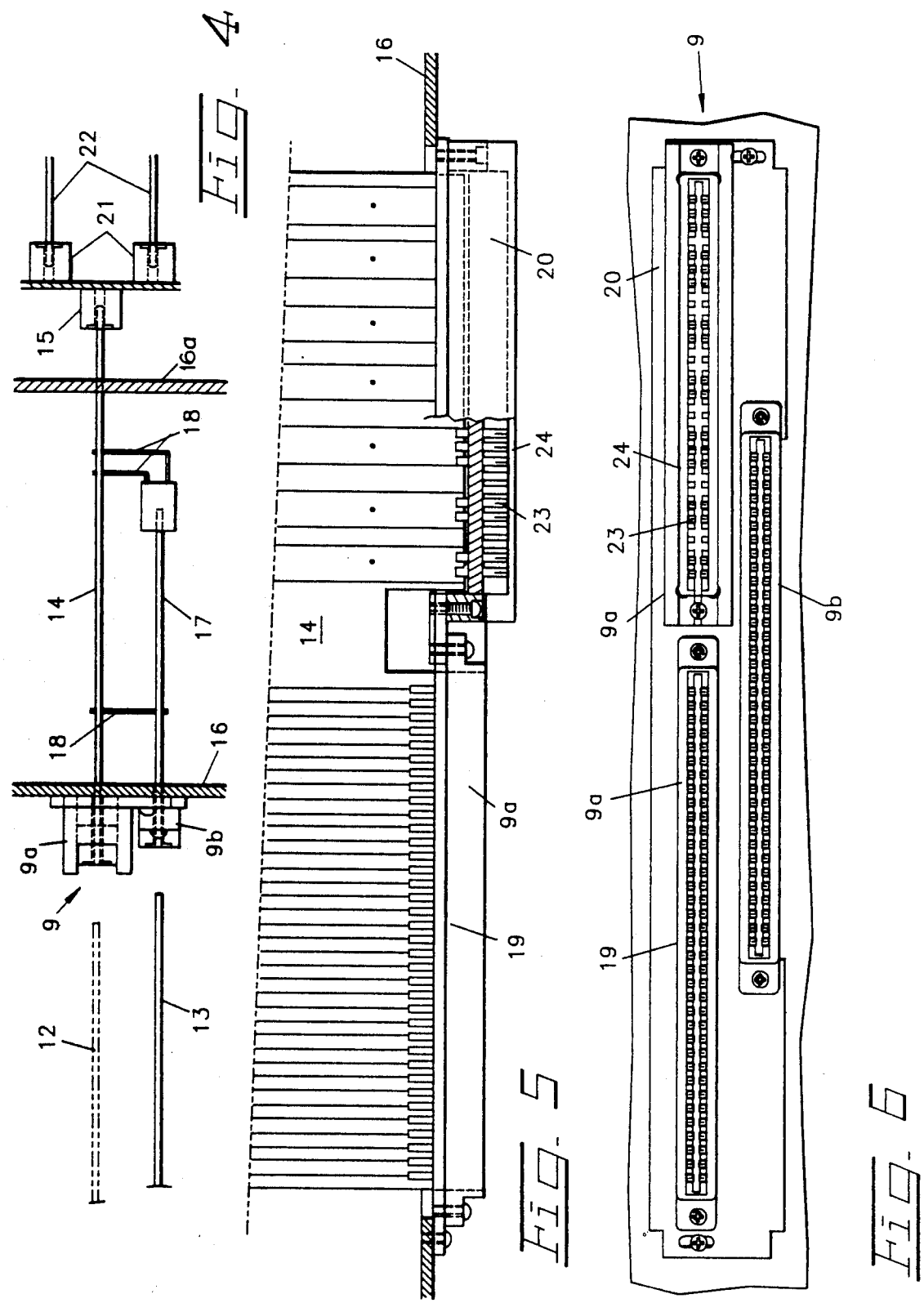

DUAL CONFIGURATION CONNECTOR PORT FOR BURN-IN SYSTEMS

FIELD OF THE INVENTION

The present invention relates to an improved burn-in apparatus for stressing electronic components under controlled environmental conditions, and more specifically to an improved equipment configuration which supplies greater flexibility with respect to the type and number of electronic components which can be conveniently and simultaneously stressed.

BACKGROUND OF THE INVENTION

Semiconductor devices, such as silicon chip integrated circuits (ICs), are subject to early failure during their life cycle. Thus, producers of these circuits have found it cost effective to rigorously stress them prior to their inclusion in electronic products. By conducting such stressing, and by the elimination of failed or weakly performing ICs in final test, the reliability of the product is greatly enhanced.

During such "burn-in", boards are used to support a number of ICs inside an oven. These boards electrically connect DC voltage with both timing and so-called "driver" circuitry via an electrical interface connector port. To achieve this, burn-in boards have circuitry printed thereon which extends to an edge of the board, so that the edge fingers of the board can be plugged into the electrical interface port. Racks are arranged to hold a number of burn-in boards in positions adjacent an equal number of interface ports, thus increasing the number of components which may be burned-in at a given time.

At first burn-in systems were custom made with many different profiles. That is, when a specific IC was to be burned-in, a timing and driver board would be designed, a burn-in board would be designed, and the appropriate interface port configuration would be developed. This, however, often resulted in the need to redesign and rebuild these components when new products were to be burned-in.

So as to minimize this problem, certain standard configurations for burn-in boards, timing and driver boards and the related interface ports began to emerge. Two specific configurations for the edge finger configuration of burn-in boards have become widely used in this industry. Therefore the configurations of the interface connector ports into which such boards may be inserted have also become standard. Unfortunately, these connector port configurations are not compatible in size or type of connection used. That is, a burn-in board having an edge finger configuration designed to mate with one type of connector will not mate with other types of connectors, and only the burn-in board designed for that system can be used in that system. Further, one of these configurations uses, in part, knife switch type contacts which have been found to be less desirable in some instances than the contact pin type.

Those who perform burn-in and burn-in services have acquired both types of these systems to ensure reliable service to their customers and the ability to obtain adequate parts and servicing of the equipment. When further burn-in capacity is required, it often becomes necessary to decide on more equipment conforming with one or the other of these systems. It would thus be preferable to acquire further capacity which would allow the use of burn-in boards of both types. This way, if either type of system breaks down or is unsatisfactory for a given application, burn-in boards from the other system could still be used in the new system.

SUMMARY OF THE INVENTION

In order to solve the above-mentioned problems, there has now been devised a burn-in system which allows the simultaneous use of two types of differently configured burn-in board electrical connectors, thereby allowing the inclusion of both types of burn-in boards in a single, simultaneous, stress environment. By providing this feature greater flexibility of use is provided.

Thus, in one embodiment, the present invention is an apparatus for accelerating the screening of integrated circuitry comprising means for supporting the circuitry, means for controlling the environment of said circuitry, means for applying electrical signals to said circuitry, and means for electrically connecting said supporting means and said means for applying electrical signals including first and second differently configured electrical connectors.

In another embodiment, the means for controlling the environment of the circuitry being burned-in comprises an oven, whereby the oven may be used to apply air at elevated temperatures to said circuitry.

In a further embodiment, the means used to support the circuitry to be burned-in comprises a burn-in board, or a plurality of burn-in boards, the burn-in boards being supported by racks.

In a further embodiment, the apparatus may also include means to measure the response of the integrated circuitry being burned-in to the means for applying electrical signals, so that the performance of the integrated circuitry can be monitored and evaluated during burn-in.

In an additional embodiment, the means for applying electrical signals may comprise a timing and driver board, the timing and driver board having circuitry thereon designed to produce varying electrical signals known as exercising signals.

In a preferred embodiment, the apparatus includes first and second differently configured electrical connectors electrically communicating with a single means for applying electrical signals, such as a single timing and driver board.

In this preferred embodiment, knife-switch type connections have been eliminated, thereby providing more efficient connections.

BRIEF DESCRIPTION OF THE DRAWINGS

The invention will be further understood by reference to the appended drawings of which:

FIG. 4 is a side view of the connector ports of the invention showing the position of the two types of ports, the electrical connections between the ports, and the electrical connections to a driver board and measuring circuitry;

FIG. 5 is a top view of one connector port configuration showing how the connector is structured;

FIG. 6 is a front view of the connector port configurations of the invention showing two different electrical connections.

DETAILED DESCRIPTION OF THE PREFERRED EMBODIMENT

The invention will now be described in detail with respect to the figures.

Figure 1:
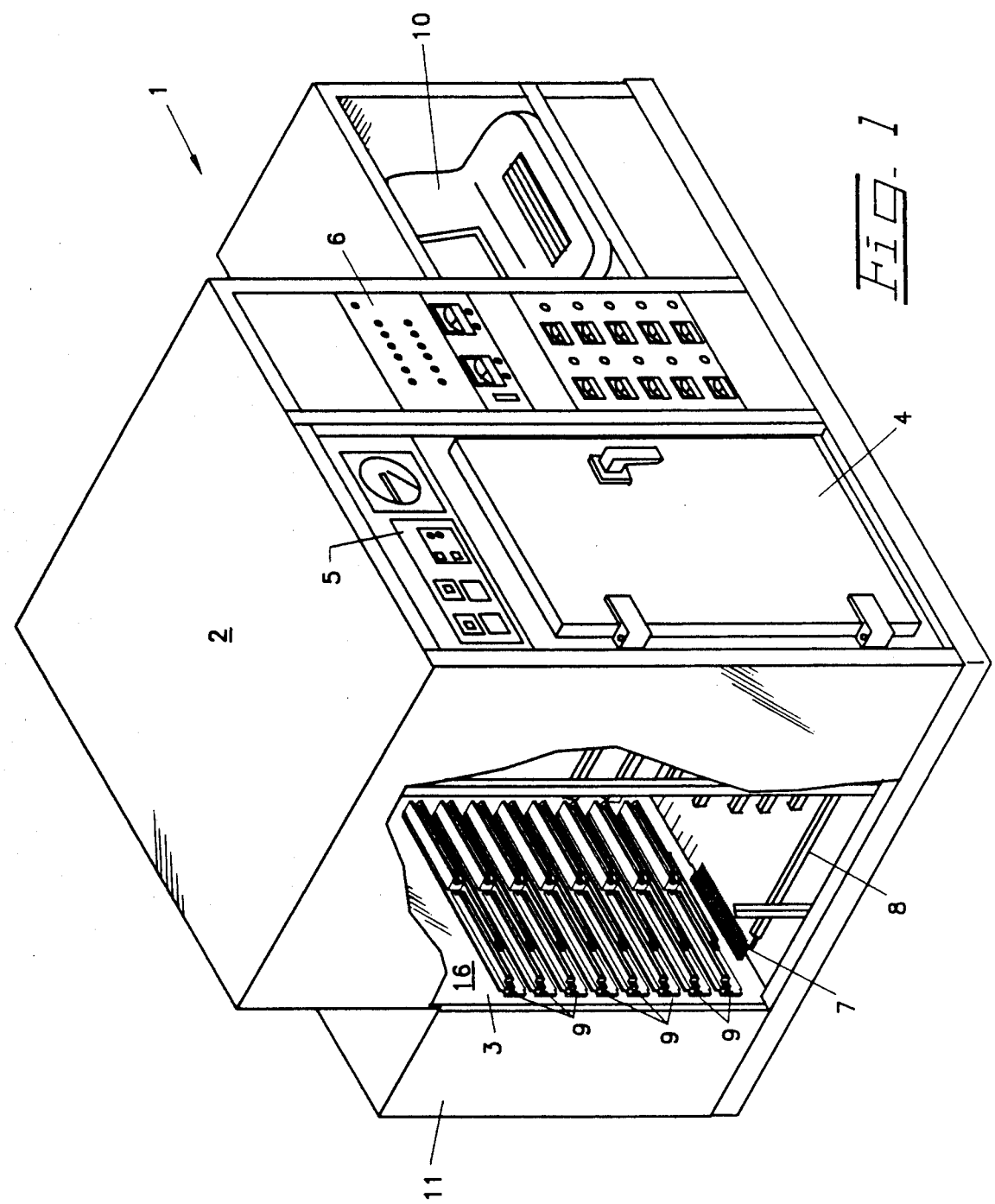
FIG. 1 is an overall perspective view of a burn-in system apparatus, with partial cutaway showing a plurality of connector ports.

Referring now to FIG. 1, an overall burn-in system 1 for screening integrated circuitry is shown. The system comprises large housing 2 in which a means for controlling the environment therein, such as an oven 3, shown in cut-away view, is contained. Oven door 4 permits access to oven 3. Control panel 5 positioned above oven door 4 permits conditions in the oven (such as the temperature and air flow) to be set and controlled. Also integrated with housing 2, smaller instrument panel 6 contains the circuitry and hardware necessary for monitoring testing activities which take place when burn-in boards are electrically connected within oven 3. That is, panel 6 is electrically connected through housing 2 to the series of connector ports 9, thereby allowing the output from the circuitry on a connected burn-in board to be measured. In this manner, during operation of the apparatus, it may be determined which integrated circuits on the burn-in board have failed or are not performing satisfactorily.

FIG. 1 shows a single burn-in board 7. Board 7 is supported by rail members 8 (shown cut-away) and is not yet inserted in one of system connector ports 9. A computing device, such as a microcomputer 10 may be used as a data analyzing device, and for data storage. In a manner known to those in this art, computer 10 may also be programmed to run specific tests on integrated circuitry placed on burn-in board 7 via connections to a timing and driver board.

Figure 2:
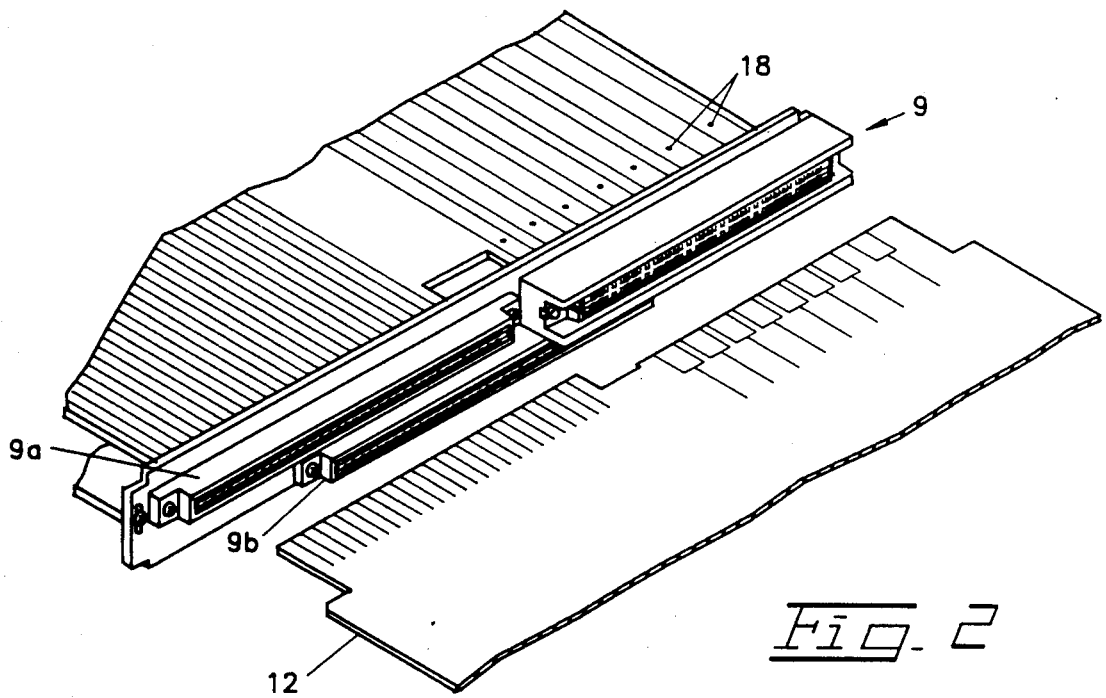
FIG. 2 is a perspective view of one embodiment of the connector port configuration of the invention, showing how the port interfaces with a burn-in board having a particular edge finger configuration.
Figure 3:
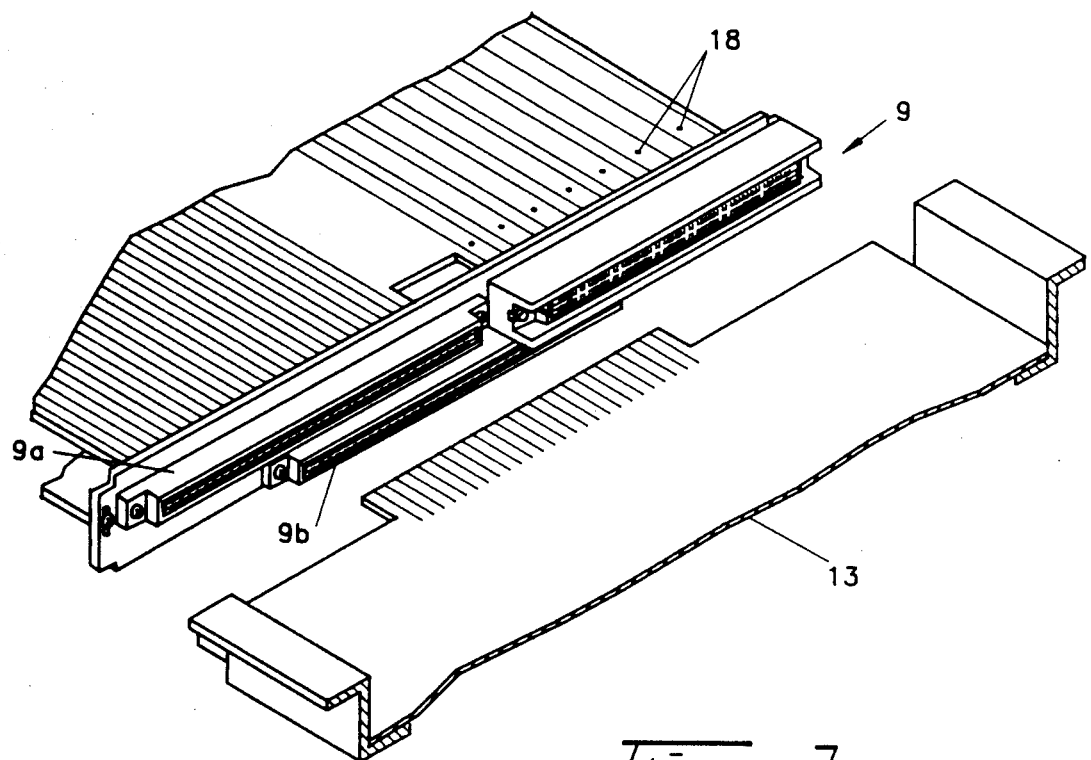
FIG. 3 is a perspective view of the connector port of the invention showing how the port interfaces with a burn-in board having a second, different edge finger configuration.

The burn-in system of the invention is designed to accept more than a single type of burn-in board. Specifically, as shown in FIGS. 2 and 3, connector ports 9 are specially adapted to receive burn-in boards having different edge finger configurations. In FIG. 2, one such board 12 is shown positioned adjacent ports 9a, the upper ports on connector port 9. Board 12 will fit only in upper position 9a because of the specific type of edge finger configuration used.

In FIG. 3, a burn-in board 13 having a different edge finger configuration is positioned adjacent, but not yet inserted, in lower position 9b of connector port 9. As can be seen, board 13 will fit only in lower position 9b and cannot be inserted in upper ports 9a. Thus, each station within the oven 3 has two differently configured electrical connectors adapted to mate electrically with burn-in boards having correspondingly different edge finger configurations.

Referring again to FIG. 1, it can be seen that connector ports 9 are positioned such that upper and lower positions 9a and 9b shown in FIGS. 2 and 3 are substantially flush with the internal rear panel of oven 3 in FIG. 1.

FIG. 4 shows the electrical connections of one of the interface ports 9 which extend through oven external backwall 16a and outside of oven 3 in FIG. 1 and into rear housing 11 of FIG. 1.

On the left of FIG. 4, burn-in board 12 and burn-in board 13 are shown. Board 12 is shown in dashed lines to indicate that interface port 9 is designed so as to accept only one or the other of boards 12 and 13, but not both at the same time. As is discussed below with regard to FIG. 7, however, more than one type of burn-in board can be used at the same time in the apparatus, since a plurality of ports like port 9 are used in the burn-in apparatus.

Referring again to FIG. 4, the electrical connections within upper ports 9a of port 9 are electrically connected through oven back wall 16 and second wall 16a of oven 3 via printed circuit board 14 (also shown in top view in FIG. 5). Printed circuit board 14 extends to rear connections 15 so that power from a power source may pass along timing and driver board 22 through one of connections 21 and along traces on printed circuit board 14 to both the upper and lower portions of port 9 so as to provide power to burn-in boards 12 or 13. Likewise return circuitry is provided on printed circuit board 14 to allow current to pass from integrated circuitry which would be positioned on the connected burn-in boards board back through port 9, across printed circuit board 14 to connections 15. Driver board 22 will be connected to one of connections 21, while an additional printed circuit board may be mated with another of connections 21, in a manner known to those skilled in the art, so that signals coming from the ICs on the burn-in board can pass to the measuring circuitry of the system, if this is desired.

Port 9b of FIG. 4 provides electrical communication through oven back wall 16, then along a printed circuit board 17. In order to connect port 9b electrically to the system current is carried from a power supply along driver board 22, through one of connections 21, through connection 15, along connecting wires 18 to printed circuit board 17, to port 9b. Thus, when inserted, board 13 will be powered up and DC signals matrixed properly.

As can be seen in both FIGS. 5 and 6, the right most portion 20 of ports 9a protrudes further into oven 3 than left most port 19. This configuration is specially designed to accommodate one type of burn-in board, such as the burn-in board now commonly in use made by Reliability Incorporated of Houston, TX. FIG. 2 shows specifically how such a burn-in board will mate with ports 9a.

FIG. 5 shows the manner in which ports 9a and 9b are mounted on back wall 16 of oven 3, and shows the right most portion 20 of ports 9a in partial cutaway view. This arrangement of pins 23 within housing 24 is used to ensure proper electrical contact between pins 23 and the traces on printed circuit board 14. It has been found that the use of this combination of contact pins with surrounding housing is especially advantageous since it eliminates the need for knife switch type contacts normally used for this purpose in the prior art system, such as the Reliability Incorporated system. When a burn-in board is inserted in ports 9a, this contact pin type arrangement provides more consistent voltage drop characteristics, which, in turn, allows the entire system to more consistently meet performance specifications for such burn-in apparatus.

FIG. 6 is a front view of connector port 9 showing the relative positions of ports 9a versus port 9b. Both the left most portion 19 of ports 9a and port 9b comprise a female thirty-six pin electrical connector. Port 9b (as seen in FIG. 4) does not protrude to the same extent as portion 20 of ports 9a. Port 9b is specifically configured to accommodate a different type of burn-in board than ports 9a, thus giving the system the flexibility of accepting either of two types of burn-in boards. The 36 pin configuration of port 9b accepts a burn-in board having an edge finger configuration such as that produced by Aehr Test Systems, of Menlo Park, CA, as specifically shown in FIG. 3.

Figure 7:
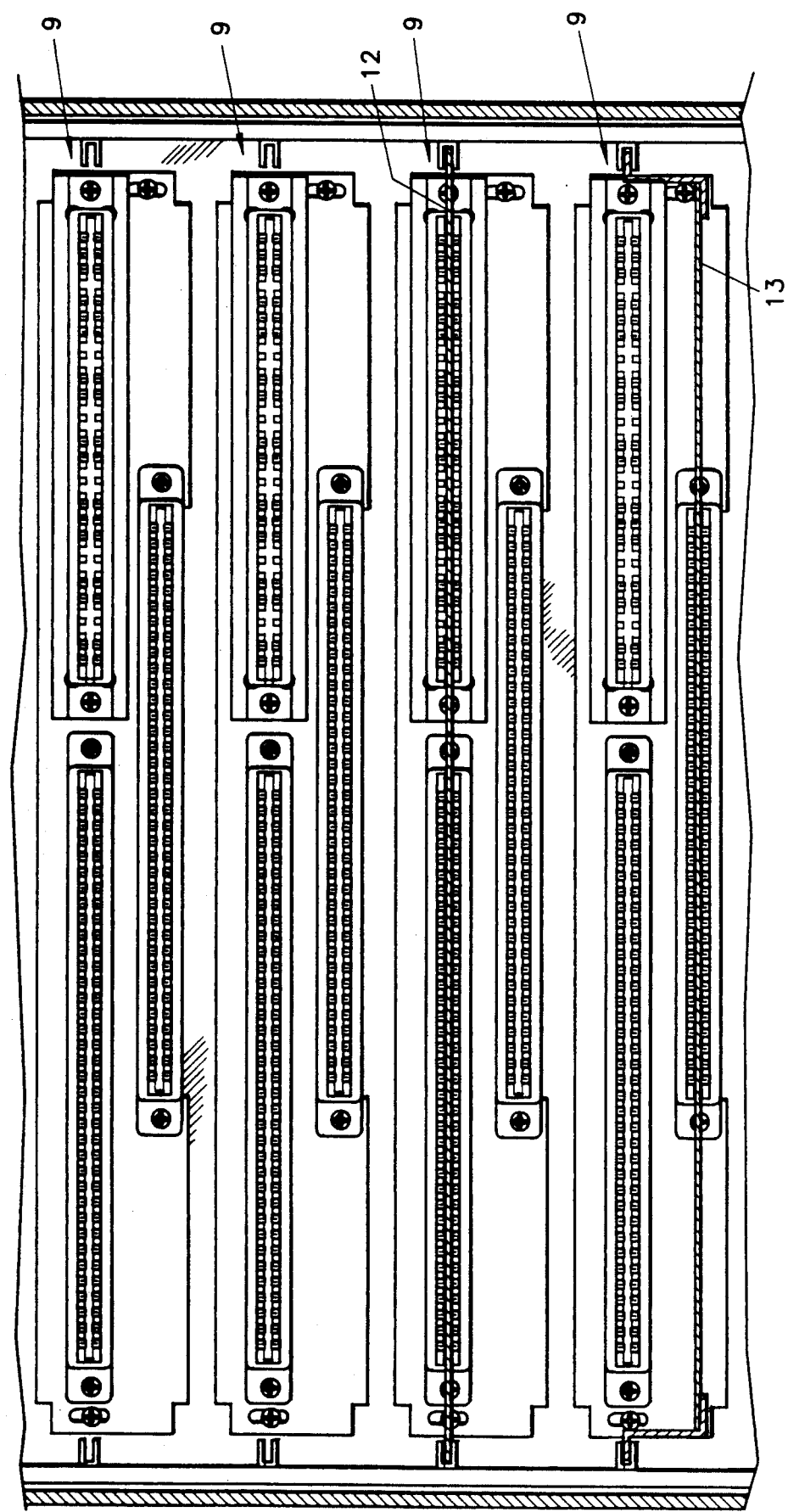
FIG. 7 is a front view similar to FIG. 6, but showing a plurality of the port interface configurations as "stacked" for use in a burn-in system.

Finally, FIG. 7 shows a stack of system connector ports 9 illustrating that, when stacked, a burn-in system including such interface ports will accommodate two types of burn-in boards, even though individual connector ports 9 will accept only one or the other of such boards. For example, a first type of burn-in board 12 may be inserted into one interface port 9, while a second type board 13 may be plugged into a second port 9. In FIG. 7, the two upper ports are shown without any burn-in boards in place. It is noted, however, that such ports could be used in the same manner as either of the lower ports shown.

The advantage of this system is greater flexibility for those who burn-in integrated circuit components. It is heretofore not been possible to utilize more than a single burn-in board type within a single burn-in apparatus without a sundry of adapter hardware.

While a single, specific, embodiment of the invention has been disclosed in the drawings, it will be recognized by those skilled in this art that many modifications can be made to the basic structure of the invention without departing from the spirit thereof. For example, the system could be designed to accept burn-in boards having edge finger configurations different from those shown, with the limitation that the system simultaneously provide at least two differently configured connector ports.

What is claimed is:

1. An apparatus for accelerating the burn-in of integrated circuitry at a plurality of stations, comprising:
    means for supporting and directing electrical energy to said circuitry at each of said stations;
    means for applying electrical signals to said circuitry;
    means for electrically connecting said supporting means to said means for applying electrical signals, said means including at each of said stations first and second differently configured electrical connectors, each of which is adapted to mate with a different electrical connector separately provided for by said supporting means;
    means as part of said apparatus for controlling the environment of said circuitry when the same is supported at each of said stations; and wherein
    said means for supporting said circuitry includes rail supports positioned adjacent said first and second differently configured electrical connectors at each of said stations for holding a circuit board in a proper position for engagement with said first connector, and a supporting rack engageable by said rails to hold a different board in a proper position for engagement with said second connector.

2. The apparatus of claim 1, wherein said means for supporting said circuitry comprises a burn-in board and supporting rack.

3. The apparatus of claim 1, wherein said means for controlling the environment of said circuitry comprises an oven chamber.

4. The apparatus of claim 1, wherein said first and second differently configured electrical connectors are housed within two differently configured interface ports.

5. The apparatus of claim 1, wherein said differently configured electrical connectors are of the contact pin type.

6. An apparatus for accelerating the burn-in of integrated circuitry comprising:
    (a) an oven chamber for controlling the environment of said circuitry during said burn-in;
    (b) a plurality of stations in said oven, each of which has first and second differently configured electrical connectors;
    (c) rails at each of said stations for holding a circuitry supporting printed circuit board for connection to a first one of said differently configured electrical connectors; and
    (d) a supporting rack for engagement with said rails at each of said stations to properly locate a circuitry supporting printed circuit board to mate with said second differently configured electrical connector at said station.

* * * * *